United States Patent [19]
Priem et al.

[11] Patent Number: 5,654,742
[45] Date of Patent: Aug. 5, 1997

[54] METHOD AND APPARATUS FOR PROVIDING OPERATIONS AFFECTING A FRAME BUFFER WITHOUT A ROW ADDRESS STROBE CYCLE

[75] Inventors: Curtis Priem, Fremont; Chris Malachowsky, Santa Clara; Shuen Chin Chang, San Jose; Hai Duy Ho, Milpitas, all of Calif.

[73] Assignees: Sun Microsystems, Inc., Mountain View; Samsung Semiconductor, Inc., San Jose, both of Calif.

[21] Appl. No.: 451,476

[22] Filed: May 26, 1995

Related U.S. Application Data

[63] Continuation of Ser. No. 145,374, Oct. 29, 1993, abandoned.

[51] Int. Cl.[6] ................................................. G09G 5/00
[52] U.S. Cl. ........................... 345/185; 345/200; 395/515
[58] Field of Search ..................................... 345/188, 186, 345/200, 190, 191, 193, 185, 189; 395/166, 164, 425; 365/189.01, 230.01

[56] References Cited

U.S. PATENT DOCUMENTS

| | | | |
|---|---|---|---|
| 3,789,367 | 1/1974 | Dumstorff | 395/166 |
| 4,546,451 | 10/1985 | Bruce | 395/166 |
| 4,979,145 | 12/1990 | Remington | 395/425 |
| 5,134,582 | 7/1992 | Ishii | 345/191 |
| 5,274,364 | 12/1993 | Li | 345/118 |

OTHER PUBLICATIONS

Pinkham et al. "A 128K×8 70 Mhz Multiport Video RAM with Auto Register Reload and 8×4 Block WRITE Feature" IEEE J. Solid–State Circuits 23(5):1133–1139, Oct. 1988.

*Primary Examiner*—Chanh Nguyen
*Attorney, Agent, or Firm*—Blakely Sokoloff Taylor & Zafman LLP

[57] ABSTRACT

A frame buffer designed to allow frame buffer operations which do not involve new row addresses to be accomplished without the need for a RAS cycle. The elimination of RAS cycles for address loading and similar functions substantially accelerates the operation of the frame buffer both as to functions which do not involve memory array addresses and those which do involve memory array addresses.

20 Claims, 9 Drawing Sheets

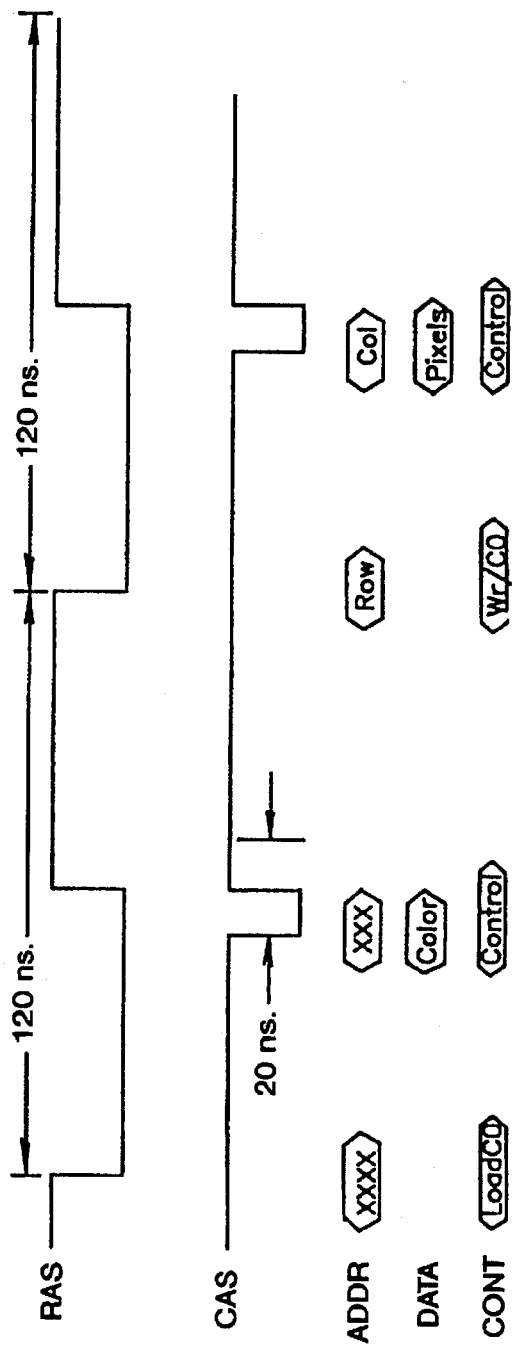
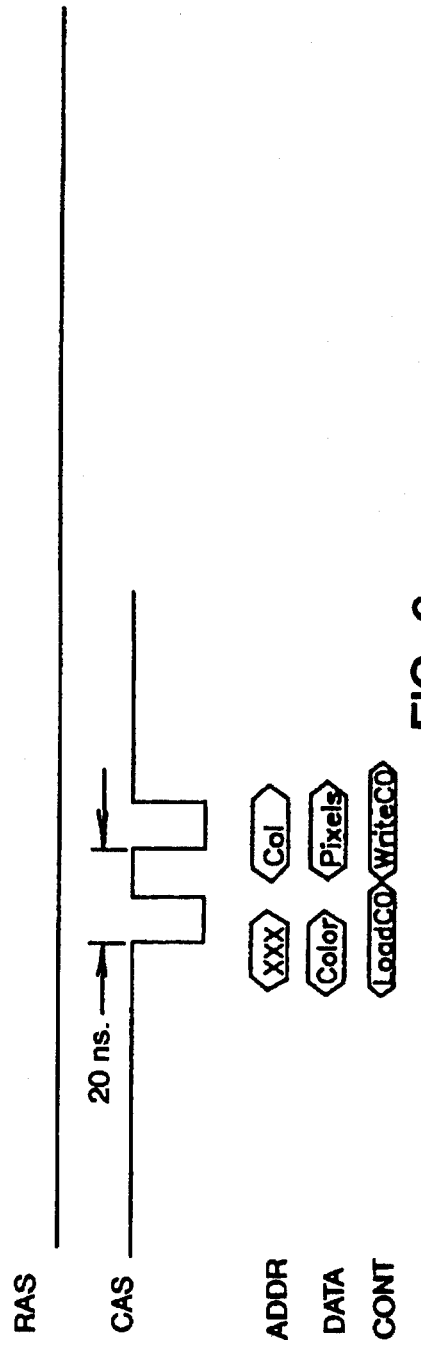
FIG. 5 (PRIOR ART)
FIG. 6

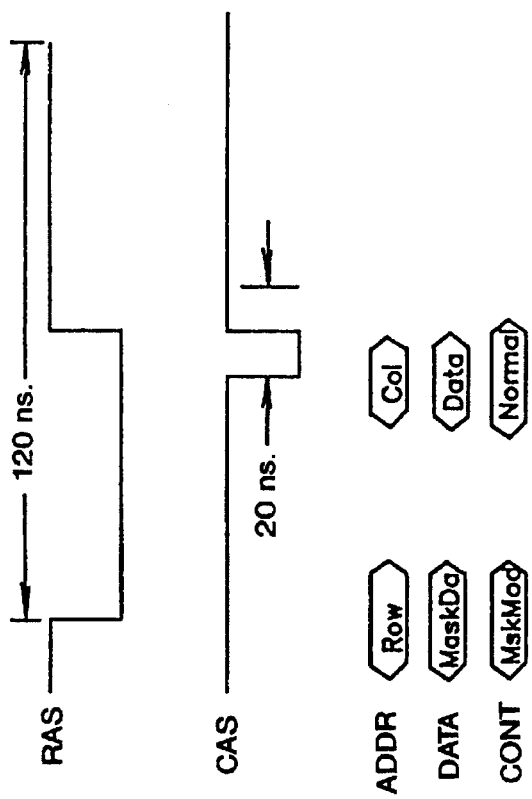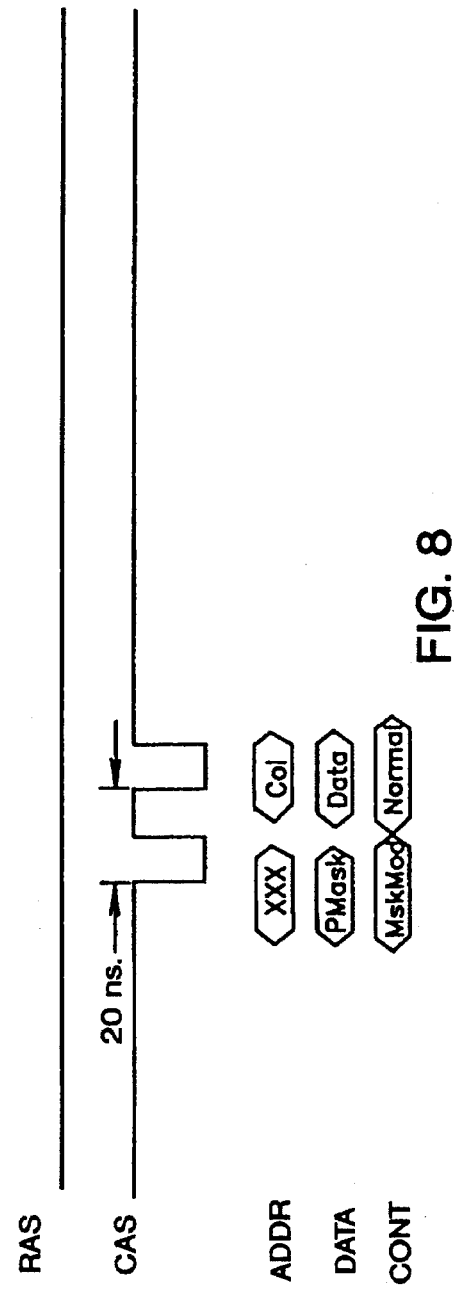
FIG. 7 (PRIOR ART)
FIG. 8

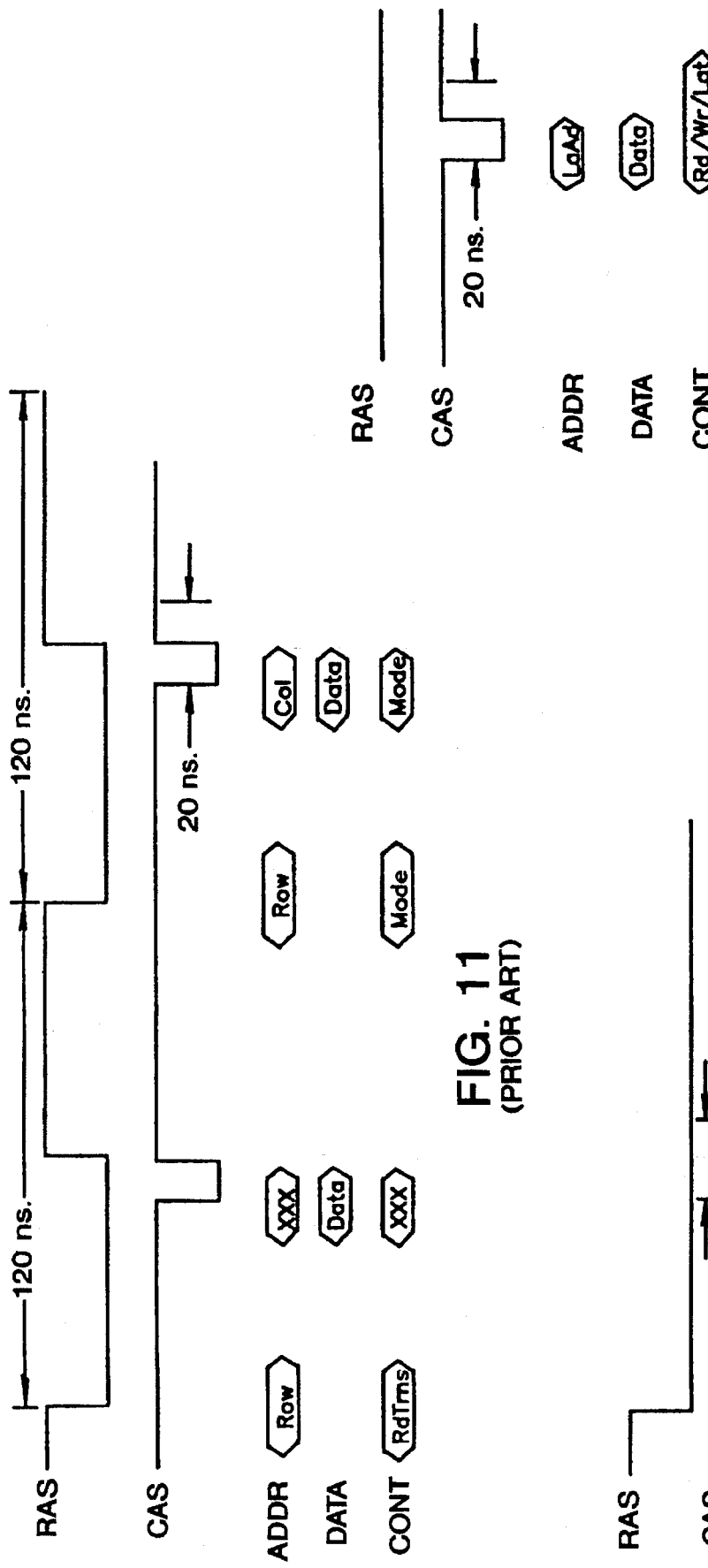
FIG. 11 (PRIOR ART)
FIG. 12
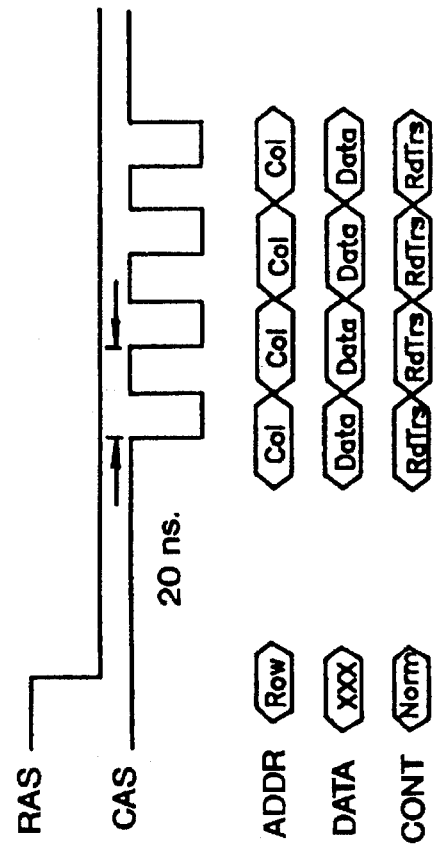
FIG. 13

METHOD AND APPARATUS FOR PROVIDING OPERATIONS AFFECTING A FRAME BUFFER WITHOUT A ROW ADDRESS STROBE CYCLE

This is a continuation of application Ser. No. 08/145,374 filed Oct. 29, 1993, now abandoned.

BACKGROUND OF THE INVENTION

1. Field Of The Invention

This invention relates to computer systems and, more particularly, to methods and apparatus for providing very fast modes of operation in a frame buffer which stores data for display on an output display device.

2. History Of The Prior Art

One of the significant problems involved in increasing the operational speed of desktop computers has been in finding ways to increase the rate at which information is transferred to an output display device. Many of the various forms of data presentation which are presently available require that copious amounts of data be transferred. For example, if a computer output display monitor is operating in a color mode in which 1024×780 pixels are displayed on the screen and the mode is one in which thirty-two bits are used to define each pixel, then a total of over twenty-five millions bits of information must be transferred to the screen with each frame that is displayed. Typically, sixty frames are displayed each second so that over one and one-half billion bits must be transferred each second in such a system. This requires a very substantial amount of processing power. In general, the transfer of this data to the display slows the overall operation of the computer.

In order to speed the process of transferring data to the display, various accelerating circuits have been devised. In general, these circuits are adapted to relieve the central processor of the computer of the need to accomplish many of the functions necessary to transfer data to the display. Essentially, these accelerating circuits take over various operations which the central processor would normally be required to accomplish. For example, block transfers of data from one position on the screen to another require that each row of pixel data on the screen being transferred be read and rewritten to a new row. Storing information within window areas of a display requires that the data available for each window portion be clipped to fit within that window portion and not overwrite other portions of the display. Many other functions require the generation of various vectors each time an image within a window on the display is moved or otherwise manipulated. When accomplished by a central processing unit, all of these operations require a substantial portion of the operational time of the central processing unit. Many of these repetitive functions may be accomplished by a graphics accelerator so that the central processor is relieved of this burden. In general, it has been found that if operations which handle a great number of pixels at once are mechanized by a graphics accelerator, then the greatest increase in display speed may be attained. This, of course, speeds the operations involved in the display of graphical material.

A problem which has been discovered by designers of graphics accelerator circuitry is that a great deal of the speed improvement which is accomplished by the graphics accelerator circuitry is negated by the frame buffer circuitry into which the output of the graphics accelerator is loaded for ultimate display on an output display device. Typically a frame buffer offers a sufficient amount of dynamic random access memory (DRAM) to store one frame of data to be displayed. However, transferring the data to and from the frame buffer is very slow because of the manner in which the frame buffers are constructed. Various improvements have been made to speed the access to frame buffers. For example, two-ported video random access memory (VRAM) has been substituted for dynamic random access memory so that information may be taken from the frame buffer at the same time other information is being loaded.

A block mode of writing has been devised for certain frame buffers which handle four bit color modes in order to increase writing speed. In this block mode, the data transferred on the data bus indicates, not pixel values, but control signals signifying whether a pixel is to be written or not. A color register stores a color value which is written to the pixel position of the pixel position is enabled by the control signal on the data bus. Nothing is written to a pixel position which is not enabled. This block mode of operation allows simultaneous writes of the single color stored in the color register to a number of pixel positions equal to the number of conductors on the data bus.

Using this block mode of operation with a color value register speeds up writing four bit color to a frame buffer under many of the conditions in which lack of speed is most obvious. Unfortunately, this mode of operation has a number of limitations. First, it has been used only with systems using four bit color pixels and has never been adapted to use with more modern color systems. More importantly, typical operations which are accomplished with the data in any window of the display involve a manipulation of two colors. For example, when text is written to the screen, the color of each letter and the color of the background surrounding that letter are manipulated by varying the pixels stored in the frame buffer for describing the image on the display. Unless both colors are written, no outline is provided for the text. Both the software which provides data for display and the various graphical rendering devices which accelerate the manipulation of that data are capable of manipulating two colors at once and usually do so. However, the frame buffers which are available for desktop computers are capable of varying no more than a single color at a time in the block mode in which a number of pixels may be addressed simultaneously. Thus, though the modern rendering devices speed up the manipulation of data, the presentation slows at the frame buffer which is able to accept only a single color at a time when presented data in the block mode of operation. This problem has been especially acute because each time a different color is used for a group of pixels, the color register must be updated from the old color value to the new color value in a time consuming operation before the new color may be used. Thus, a background color must be first placed in the color value register in one operation for a first row on the display. Next, the pixels of that color must be written to various pixel positions in the frame buffer. Then, the color must be changed to the foreground color in the register, and those pixels of the foreground color described in a second write operation. When, the next row of pixels is written to the frame buffer, the entire operation must be repeated again.

Recently, an arrangement has been devised which allows two colors to be written simultaneously in a block mode write operation which may be used for more modern color modes. The arrangement uses a plurality of color value registers on the frame buffer to store a plurality of color values. This arrangement eliminates the necessity to reload the color value registers during the writing of a window, allows multiple color modes to be utilized, and accelerates writing dramatically. The arrangement is described in detail in co-pending U.S. patent application Ser. No. 08/145,756, entitled *Apparatus For Providing Fast Multi-Color Storage In A Frame Buffer*, Priem et al., filed on even date herewith, now U.S. Pat. No. 5,504,855.

One of the slowest operations performed using a prior art frame buffer is the scrolling of data. In a scrolling operation rows of data are moved up or down on the output display. Since the data describing the pixels which are displayed on an output display device is stored in a frame buffer, scrolling requires that the pixel data in the frame buffer describing a row of the display be read from the frame buffer by the central processor and then written back to another position in the frame buffer. In a typical personal computer, thirty-two bits of data (one pixel in thirty-two bit color or four pixels is eight bit color) are read from the frame buffer in an operation that typically requires 120 nanoseconds. This is followed by an access to write the data back to the appropriate positions in the frame buffer which again requires 120 nanoseconds. This pattern of reading and writing is continued until an entire row has been read and rewritten. Since a typical screen may hold rows of 1024 pixels, 240 nanoseconds times 1024 pixels is required to scroll a single row of thirty-two bit color pixels on the display or one-fourth that time for eight bit pixels. Each line of text takes up approximately twelve rows of pixels so scrolling a line of text takes a very long time.

The frame buffer described in the above-mentioned patent application may be modified to include new circuitry for providing very fast scrolling of data. Such scrolling is approximately 85 times faster than scrolling in prior art frame buffers. The arrangement is described in detail in co-pending U.S. patent application Ser. No. 08/145,791, entitled *Method and Apparatus For Increasing The Rate Of Scrolling In A Frame Buffer Designed For Windowing Operations*, Priem et al., filed on even date herewith.

Along with the new frame buffer described in the above-mentioned patent applications, new apparatus and methods of writing large blocks of data to a frame buffer have been devised which greatly accelerate writing to a frame buffer. The details of this apparatus and associated methods are described in co-pending U.S. patent application Ser. No. 08/145,755, entitled *Multiple Block Mode Operations In A Frame Buffer System Designed For Windowing Operations*, Priem et al., filed on even date herewith, now U.S. Pat. No. 5,533,187.

Even with these improvements, frame buffers still lack sufficient speed. One of the problems which all frame buffers have faced is that they have been designed so that a row address strobe cycle and a column address strobe cycle are necessary concomitants of almost all of the operations performed using the frame buffer. Naturally, when a memory cell in the random access memory in which the frame buffer stores its pixel data is accessed to read or write the pixel data, a row address strobe cycle and a column address strobe cycle are used for the access. However, in typical frame buffers such RAS and CAS cycles are also required when a frame buffer register is accessed, when pixel data is transferred in entire rows to the display, and for many other operations. Most of these operations have little or nothing to do with selecting a particular row or column in the frame buffer array yet row address and column address strobe cycles are still required. At the present state of the art, a typical row address strobe cycle requires 120 nanoseconds to accomplish while a typical column address strobe cycle requires 20 nanoseconds. The necessity of these strobe cycles, especially the row address strobe cycle, substantially lengthens the access time for these non-related functions.

SUMMARY OF THE INVENTION

It is, therefore, an object of the present invention to provide a new design of frame buffer capable of speeding the display of data by factors which are at least an order of magnitude of the rate at which display can be accomplished with prior art frame buffers.

It is another object of the present invention to provide a new design of frame buffer in which accesses of non-array portions of the frame buffer do not, in general, require row address strobe cycles.

It is another, more specific, object of the present invention to provide a new design of frame buffer in which certain row address strobe and column address strobe cycles are eliminated in certain accesses of array portions of the frame buffer.

These and other objects of the present invention are realized in a frame buffer designed to allow frame buffer operations which do not involve new row addresses to be accomplished without the need for a RAS cycle. The elimination of RAS cycles for address loading and similar functions substantially accelerates the operation of the frame buffer both as to functions which do not involve memory array addresses and those which do involve memory array addresses.

These and other objects and features of the invention will be better understood by reference to the detailed description which follows taken together with the drawings in which like elements are referred to by like designations throughout the several views.

BRIEF DESCRIPTION OF THE DRAWINGS

FIG. 5 is a timing diagram which illustrates an operation performed using prior art frame buffers and prior art techniques.

FIG. 6 is a timing diagram which illustrates an operation similar to that illustrated in FIG. 5 performed using frame buffers in accordance with the present invention.

FIG. 7 is a timing diagram which illustrates another operation performed using prior art frame buffers and prior art techniques.

FIG. 8 is a timing diagram which illustrates an operation similar to that illustrated in FIG. 7 performed using frame buffers in accordance with the present invention.

FIG. 11 is a timing diagram which illustrates an operation performed using prior art frame buffers and prior art techniques.

FIG. 12 is a timing diagram which illustrates an operation similar to that illustrated in FIG. 11 performed using frame buffers in accordance with the present invention.

FIG. 13 is a timing diagram which illustrates another operation performed using frame buffers in accordance with the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
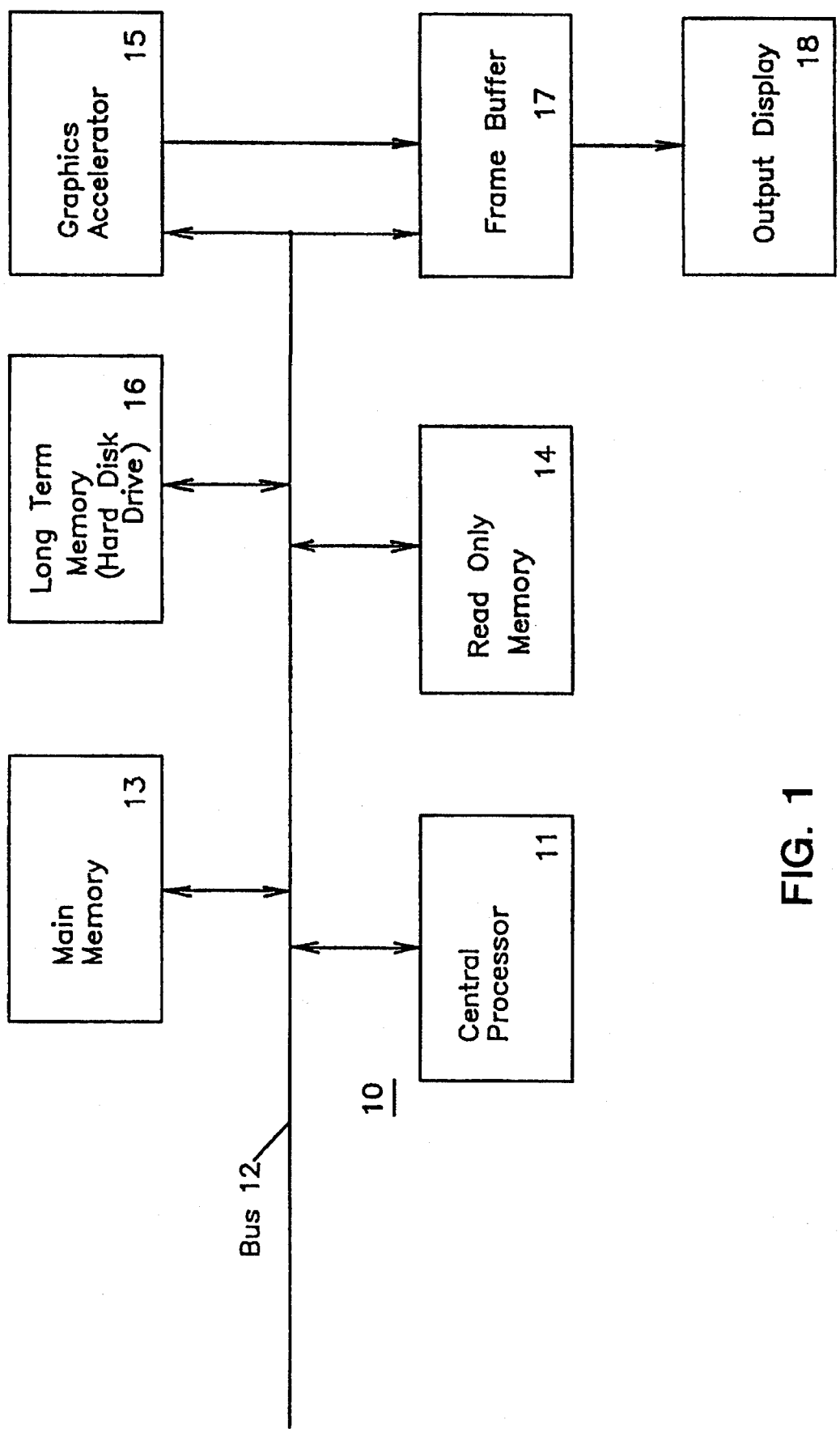
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Also connected to the bus 12 is main memory 13 which is typically constructed of dynamic random access memory arranged in a manner well known to those skilled in the prior art to store information being used by the central processor during the period in which power is provided to the system 10. A read only memory 14 which may include various memory devices (such as electrically programmable read only memory devices (EPROM)) well known to those skilled in the art which are adapted to retain a memory condition in the absence of power to the system 10. The read only memory 14 typically stores various basic functions used by the processor 11 such as basic input/output and startup processes.

Also connected to the bus 12 are various peripheral components such as long term memory 16. The construction and operation of long term memory 16 (typically electromechanical hard disk drives) are well known to those skilled in the art. Also coupled to the bus 12 is circuitry such as a frame buffer 17 to which data may be written which is to be transferred to an output device such as a monitor 18 for display. For the purposes of the present explanation, the frame buffer 17 may be considered to include in addition to various memory planes necessary to store information, various circuitry well known to those skilled in the art for controlling the scan of information to the output display. In addition, the frame buffer 17 may be connected to the bus 12 through circuitry such as graphic accelerating circuit 15 used for providing fast rendering of graphical data to be furnished to the frame buffer 17.

Figure 2:
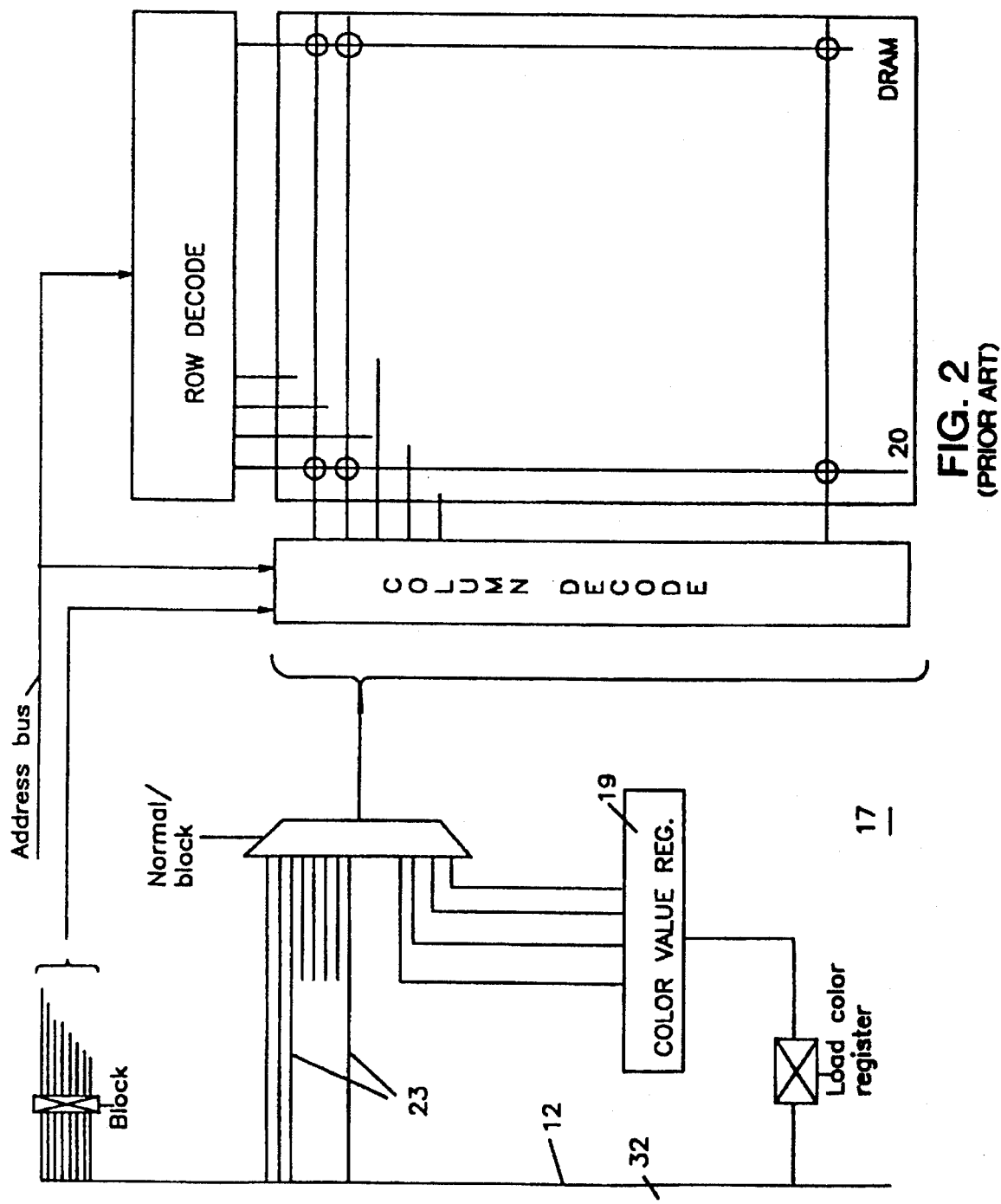
FIG. 2 is a block diagram illustrating a frame buffer designed in accordance with the prior art.

FIG. 2 illustrates a frame buffer 17 constructed in accordance with the prior art. Typically, such a frame buffer 17 includes a dynamic random access memory array designed to store information defining pixels on the output display. When a random access memory used as a frame buffer 17 is accessed in its normal mode of operation, data is written to or read from the frame buffer 17 on the conductors of the data bus 12. When the frame buffer 17 is written, all of the data conductors of the bus transfer the binary data to be stored as pixel information. In a typical computer system having a thirty-two bit bus, thirty-two bits of information may be written on the bus and appear at thirty-two input pins to the frame buffer memory. This data may define one or more pixels depending upon the number of bits required to define a pixel in the particular display mode. For example, in an eight bit color mode of operation, each pixel displayed requires eight bits of data; and thirty-two bits of data on the data conductors of the bus are capable of defining four pixels in each individual access. Writing pixel data four pixels at a time is a relatively slow method of filling the frame buffer with data to be written to the display. This is, however, the normal mode of writing pixel data to the display. This mode is typically used in any process which varies the display on a pixel by pixel basis or with any graphical image which uses more than two colors in a window.

There are many operations which affect the display, however, which manipulate very large numbers of pixels and do not require that pixels be individually varied. These operations include, for example, clearing the entire display or a window of the display, writing a file to a window, and similar operations. Because filling the frame buffer is so slow when each pixel is individually described on the data conductors, some prior art frame buffers also have apparatus which allows a mode of operation (referred to as "block mode") in which each of the data conductors controls access to four bits representing a pixel color value. This block mode allows data representing a color value to be written simultaneously to a plurality of individual pixel positions in the memory. In this block mode, the information written to the array on the data conductors is control information used to enable writing to memory positions representing particular pixel positions and to ignore other pixel positions.

FIG. 2 shows a prior art frame buffer 17, a plurality of data input conductors 23, and a color register 19. A four bit color value to be stored as pixel data in data positions in an array 20 is written into the color register 19. Data transferred to the frame buffer 17 on the data conductors 23 indicates the positions of pixels which are to be written and of those pixels which are not to be written. For example, if a data conductor 23 carries a zero value, then the pixel position is not written. If a data conductor 23 carries a one value, then the four bit color value from the color register 19 is written into the pixel position. In this way, selected ones of a number of individual pixels may be written at once using the color value stored in the color register 19. This is a very useful manipulation if it is desired to accomplish manipulation of large areas using the same color. For example, with a thirty-two bit bus, one may rapidly clear a window by writing a background color to the entire window of a display in accesses of thirty-two pixels at a time. This mode also allows pixel data to be clipped to fit within a window since it allows control signals to write a color within a window and to disable the writing of the color to pixel positions outside the window.

One problem with this prior art block mode of operation is that it can only be used with the outdated four bit color mode of operation. A more difficult problem is that prior art frame buffers are only capable of dealing with one color at a time although more than one pixel may be written simultaneously with that color using the block mode. On the other hand, the graphical accelerating devices and software which furnish pixel information to the frame buffer 17 typically manipulate two colors at once. Thus, while an entire screen may be cleared rapidly using this block mode in which a plurality of four bit pixels may be written using a color register and enabling control signals sent on the data conductors 23, more advanced manipulations slow down the system operation. For example, when any information pattern is written to the frame buffer, a first background color must be placed in the color register; and the entire first row of the particular window must be cleared by writing the background color. Then the foreground color is placed in the color register, and the foreground pixels are written to the row. Then the background color is again placed in the color register, and the entire second row of the particular window is cleared. The background color is again replaced in the color register with the foreground color, and the foreground pixels are written for the second row. This continues until all of the rows of the window have been written with both of the colors necessary to the display.

Figure 3:
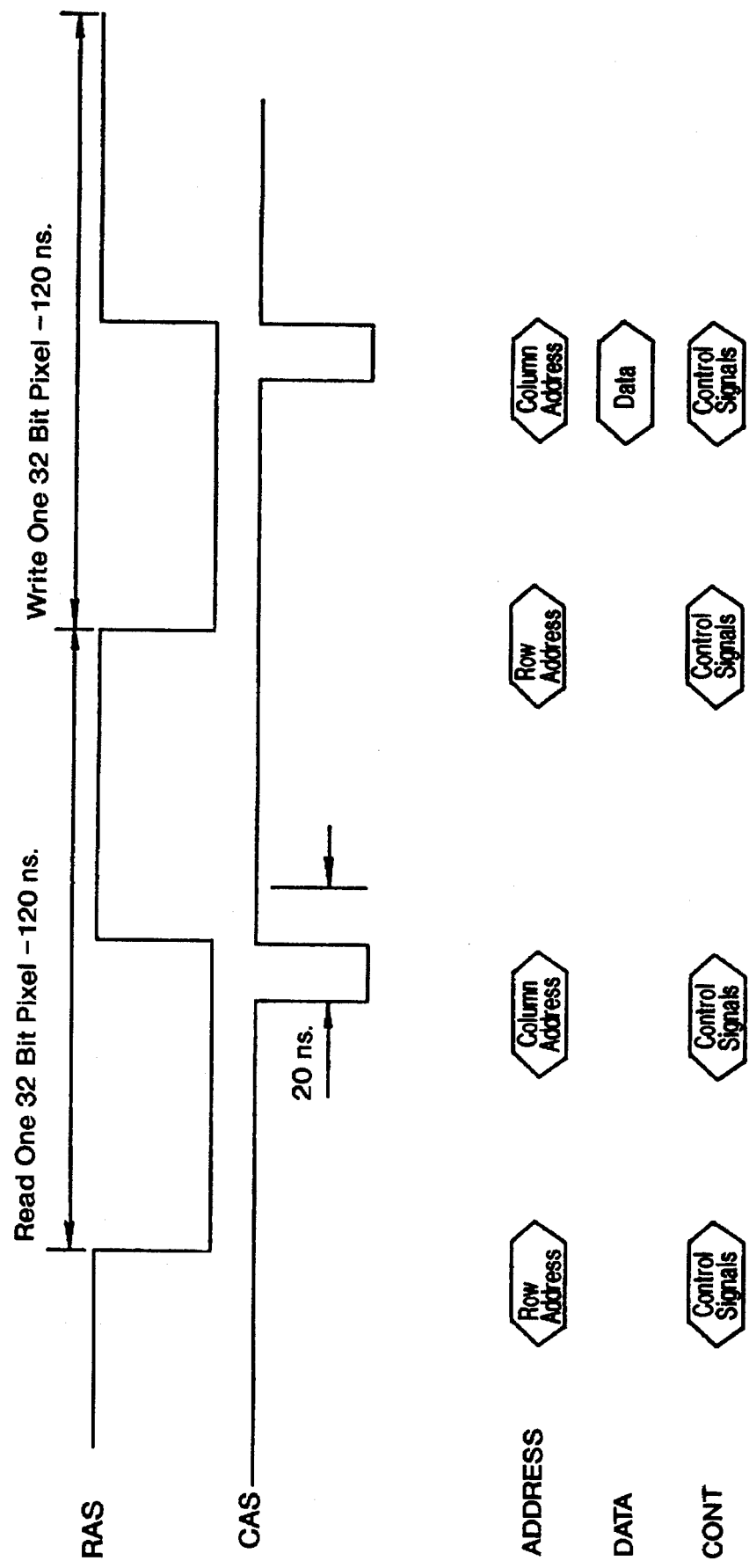
FIG. 3 is a timing diagram illustrating the operation of the prior art frame buffer of FIG. 2.

FIG. 3 is a timing diagram illustrating various control signals which are furnished during the operation of the prior art frame buffer of FIG. 2. In prior art frame buffers, each access of the frame buffer requires both a row address strobe (RAS) cycle of 120 nanoseconds and a column address strobe (CAS) cycle of 20 nanoseconds. This is true for accessing the frame buffer to load the color register and for accessing the memory positions in the frame buffer. On the falling edge of the RAS cycle, a number of control signals including a DSF control signal, a data transfer signal, a write enable signal, and similar signals (shown in general as control signals in the figure) are latched and used to indicate the particular mode in which the frame buffer is operating. Once the row address strobe has been furnished, a single CAS cycle may overlap the row address strobe signal so that a total of 120 ns. is required for any particular operation. During the falling edge of the CAS signal, read enable, data transfer signals, and similar control signals are latched and used to indicate the mode of operation. When a memory position is accessed, the row address is furnished on the falling edge of the RAS cycle; and the column address is furnished and data is written or read on the falling edge of the CAS cycle. Since this same sequence is used for other operations than accessing the memory positions of the array, to load the color register with background color takes a first 120 nanoseconds, writing the background color takes another 120 nanoseconds, reloading the color register with foreground color takes another 120 nanoseconds, and writing the foreground color takes another 120 nanoseconds.

The time necessary to reload the color register twice on each row and the requirement to write twice to each of the thirty-two-bit positions in each row together slow the operation significantly. For example, if it is desired to write to an area of a window in order to change the data presented, it is first necessary to change the value in the color register to the back ground color for the area, then write the background, then change the value in the color register again, and finally write the foreground color. Thus, to write thirty-two bits of information in block mode requires about as long as writing four individual pixels in normal mode. Although this is about eight times faster than the normal mode of writing to the frame buffer, as is obvious, this operation could be greatly accelerated if it were not necessary to go through a RAS/CAS cycle each time the color register were loaded.

A similar problem arises with prior art frame buffers when other registers used by the frame buffer are loaded. For example, frame buffers often utilize a register for storing information designating which of the planes of the frame buffer are to be accessed during any operation. Such information allows one hardware arrangement having a plurality of array planes to be configured for black and white operation, for eight bit color operation, for sixteen bit color operation, and for thirty-two bit color operation. For each of these particular color modes of operation, the planes to be accessed are stored in such a register; and the information is utilized with each row access. Loading this plane mask register also requires both a row address strobe and a column address strobe cycle to determine the correct mode of operation even though the signals are used only as control signals and neither a column nor a row is selected during these cycles. As with the loading of color registers, the need for row address strobe and column address strobe cycles substantially increases the time required to complete the operation.

A number of other operations also require row address strobe and column address strobe cycles even though the cycles are not used for row and column selection. One problem with the construction of prior art frame buffers is that the apparatus by which control signals are provided precludes the maintenance of a row address if a different operation intervenes. For example, when a row and a column address are furnished to access a first pixel in the frame buffer, the next access of that row to write another pixel requires only a column access. However, if the color written is changed or some other operation intervenes, then row and column address strobe cycles are required to latch control signals to accomplish this other operation. Then, when another pixel is to be written to the same row, both a row and a column address are necessary even though the row of the access is the same as the row of the first access. This occurs because each time a particular operation being conducted is changed to a different operation, it is necessary to use the row address strobe and column address strobe cycles along with the control signals to control the new operation. Sending row and column address strobe signals may or may not affect the row address value, but it leaves the address indeterminate so that the row address is no longer capable of being considered valid. Because of this, it is necessary for the row address to be renewed requiring a row address strobe and column address strobe cycle.

The present invention replaces the prior art method of controlling operations within the frame buffer. In the present invention, the row address strobe cycle is used only for row access operations and for no other control functions. Sufficient pins are provided that the other operations of the frame buffer are not required to be controlled by the row address strobe cycle; in the preferred embodiment, four pins are provided for four distinct DSF signals. Because the row address strobe cycle is used only for row accesses when a row address is changed, the row designated during a row address strobe cycle remains valid until a new row is selected. Even though other control functions occur, so long as those functions do not relate to another row, no further designation of the row address is necessary for operations within the same row.

By using row address strobe cycles only for row access operations, so long as the operation stays in the same row very great improvements in speed may be obtained. Moreover, it should be noted that in some operations in contrast to prior art frame buffers, data may actually be written into the frame buffer during a row address strobe cycle without the requirement of a column address strobe cycle. Prior art frame buffers always required that data be entered only on a column address strobe cycle. Since a column address strobe cycle is so short and a row address strobe cycle so long, this meant that the beginning of data entry had to be delayed until the row address strobe cycle had commenced and a column address strobe cycle could be begun. This new process shortens the period required for data entry even more. But most significantly, since only one row address strobe cycle is required for all operations within the same row, the very long multiple row address strobe cycles are eliminated.

Figure 4:
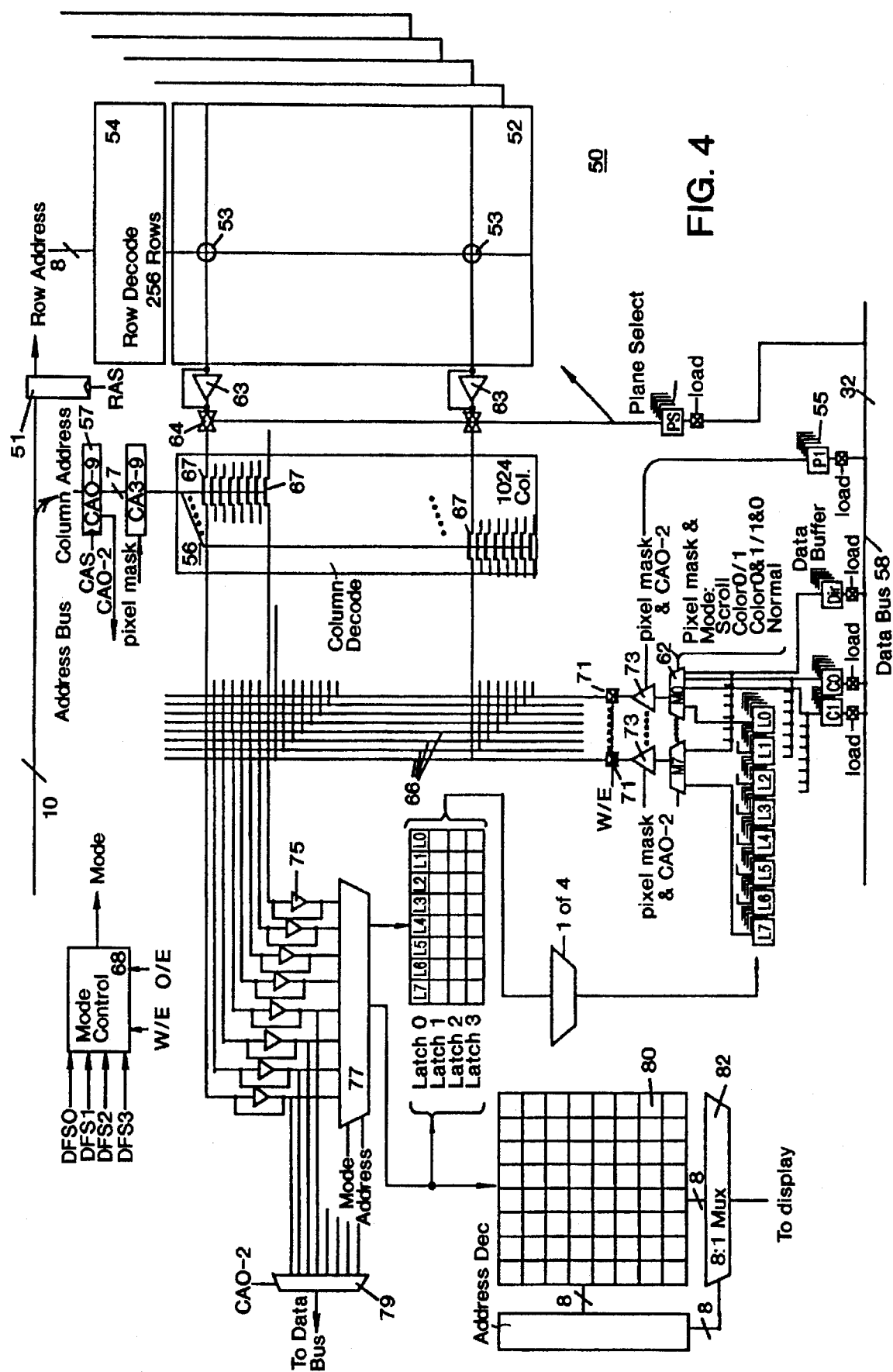
FIG. 4 is a block diagram illustrating an arrangement in accordance with the present invention.

Referring now to FIG. 4, there is illustrated a detailed block diagram of a frame buffer 50 designed in accordance with the present invention. FIG. 4 illustrates a circuit board upon which reside the various components of a frame buffer 50. The frame buffer 50 includes a plurality of memory cells 53 which includes devices such as field effect transistor devices arranged to provide a dynamic random access memory array 52. The arrangement of the cells 53 constituting the array 52 is developed in accordance with principals well known to those skilled in the art. It is adapted to provide a sufficient number of addressable memory cells 53 in the array 52 to describe the number of pixels to be presented on an output display device in a particular mode of operation. For example, the array 52 may include a total of thirty-two planes (only the first is illustrated in detail in FIG. 4), each plane including 256 rows, each row including 1024 memory cells; such an arrangement allows the storage of color data sufficient to display thirty-two bit color in a 512×512 pixel display on a color output display terminal.

In addition to the array 52, the frame buffer 50 includes row decoding circuitry 54 and column decoding circuitry 56 for decoding the addresses furnished by a controller such as a central processor and selecting individual memory cells in each plane of the array 52 which define the various pixels that may be represented on an output display device. Connected to the frame buffer 50 are data conductors 58 which may be joined to a data bus to provide data to be utilized in the array 52. Typically, thirty-two data conductors 58 are provided although this number will vary with the particular computer system. The number thirty-two matches the number of bits which are transferred to indicate the color of a single pixel of the largest number of bits usable by the display system in the most accurate color mode of operation.

When data is written to the frame buffer 50 on the conductors 58 of the data bus in the normal mode of operation, each group of thirty-two bits defines one or more color values to be displayed at one or more pixel positions on the output display. Thus, when an output display is displaying data in an eight bit color mode, the thirty-two bits carried by the data conductors 58 in normal write mode may define four pixel positions on the display. On the other hand, when a display is displaying data in a thirty-two bit color mode, the thirty-two bits of the data conductors 58 may carry information defining a single pixel position on the display. As may be seen, one of the data conductors 58 of the bus is connected through an input data buffer Din to all of eight multiplexors 62 in each plane of the array so that the data bit carried by that conductor 58 may be placed in the appropriate memory cell of the plane of the array 52. Each of the multiplexors 62 selects the source of the data to be transferred to the array 52 in each plane depending on the mode of operation selected. Thus, in normal mode, the data bit is selected directly from the data conductor 58 for that plane of the array. The bit is transferred to the particular column selected and written to that column and the selected row. Since a bit may be written in each of thirty-two planes of the array, thirty-two bits may be written from the bus conductors 58 (one to each plane) as one thirty-two bit pixel, two sixteen bit pixels, or four eight bit pixels, depending on the color mode in which the system is operating.

The embodiment illustrated in FIG. 4 is particularly adapted to be used in a system utilizing eight bit color modes. To this end, the system utilizes eight individual multiplexors 62 in each plane of the frame buffer 50 for selecting particular write input data. Each of these multiplexors 62 has its output connected to one of eight tri-state write drivers 73. The drivers 73 each furnish an output signal via a write enable switch such as a transmission gate 71 on a conductor 66 connected to every eighth column of the particular plane of the array.

As is shown in FIG. 4, a mode control circuit 68 is provided to designate the particular mode of operation in which the frame buffer is to operate. To accomplish mode selection, four control signals DSF0–DSF3 are furnished along with write enable and output enable signals. The combination of these signals produces the particular output mode control signals in a manner well known to those skilled in the prior art.

In a normal mode write operation as the technique is practiced in the prior art, a particular address is transferred on the address bus to select a particular row and column. The row address is furnished to the row decode circuitry 54 from a latch 51 enabled on the falling edge of a row address strobe signal. The selection of the row causes power to be furnished to all of the memory cells 53 of the particular row of the array in each of the selected planes. Once power has been furnished to the appropriate row of the array, the value of each memory cell in the row is sensed by a sense amplifier 63 for each column of the array. The sense amplifiers 63 are turned on, and each sense amplifier 63 drives the value sensed back to refresh the memory device 53 in the selected row.

At the falling edge of the CAS signal a latch 57 is enabled; and the column address is decoded by the column decode circuitry 56 and applied to the appropriate switches 67 to select the appropriate columns in each plane to be written. In the frame buffer 50 illustrated, the column address is ten bits. Of these ten bits, the higher valued seven bits CA3–9 of the column address are used by the column decode circuitry 56 to select a group of eight adjacent columns. The normal mode write control signal at each of the multiplexors 62 causes the data signal furnished on the single conductor 58 associated with that plane to be transferred from the data input buffer by each of the eight multiplexors 62. The lower three bits CA0–2 of the column address from the latch 57 select a particular one of the amplifiers 73 to transfer the data bit to a single one of the eight columns selected by the column decode circuitry. Thus, one of the signals produced by the multiplexors 62 is amplified by a single one of the amplifiers 73 and transferred to the addressed memory cell 53 in that plane of the array. Since each of the conductors 58 associated with each plane of the array 52 carries an individual bit for the memory cell at the selected row and column, the pixel value (or values) will be transferred to the appropriate column and row position in each plane of the array.

In a similar manner, when a particular pixel value is to be read in the normal mode of operation, the row and column address is transferred to the decode circuitry 54 and 56. A row address is selected on the falling edge of the RAS signal; and the entire row of memory cells in each selected plane of the array 52 is refreshed. At the falling edge of the CAS signal, the higher valued seven bits CA3–9 of the column address are applied to the appropriate switches 67 of the column decode circuitry 56 to select the eight adjacent columns in each plane which have been addressed and are to be read. The condition of the memory cells 53 in each of these eight columns of each selected plane is sensed by a second set of output sense amplifiers 75. The output of a particular one of the columns is selected by a multiplexor 79 in each plane. The multiplexor 79 is controlled by the normal mode read signal and the value of the lower three bits CA0–2 of the column address. This causes the condition of a particular memory cell 53 to be transferred to a particular one of the conductors 58 of the data bus associated with that plane of the array 52.

The frame buffer 50 also includes a pair of color value registers C0 and C1 which are utilized to store color values which may be used in color block modes of operation described hereinafter in which a plurality of storage positions may be written simultaneously. Each plane of the array includes a one bit register C0 and a one bit register C1 for storing one bit of a color value. Since each plane includes one bit for each register, each register C0 and C1 includes a total of thirty-two bits. Thus an entire eight bit color value may be stored in the registers C0 and C1 residing on eight planes, an entire sixteen bit color value may be stored in the registers C0 and C1 residing on sixteen planes, and an entire thirty-two bit color value may be stored in the registers C0 and C1 of thirty-two planes of the frame buffer 50. With a thirty-two bit color register such as is shown, the color pattern for a particular eight bit color may be repeated four times in each color register (similarly a sixteen bit color may be repeated twice). The color registers C0 and C1 may be selectively addressed so that they may be loaded by data furnished on the conductors 58 of the data bus; as may be seen, switches are provided in each cell plane to allow loading of the registers C0 and C1 with data from the data conductors 58. The details of the color block registers are described in the U.S. patent application entitled *Apparatus For Providing Fast Multi-Color Storage In A Frame Buffer,* referred to above.

However, an abbreviated description of the use of the color registers is provided at this point to aid understanding of the present invention. The multiplexors 62 may select for writing not only the data values carried by the conductors 58 but also the values stored in the color registers C0 and C1. The selection depends on the particular color mode of operation, a value indicated by control signals furnished by the central processor or by the graphical accelerating device.

When a color block mode of operation is indicated by the control signals, the data conductors 58, rather than carrying pixel data, carry enabling signals to indicate pixel positions in the array 52 to which the color values held in the registers C0 and C1 are to be written. These color values are loaded from the data conductors 58 of each array plane of the frame buffer 50 in response to a load color register control signal. Since two color registers C0 and C1 are provided in the preferred embodiment, a total of four color block modes of operation are possible. These modes are referred to as color 0 mode, color 1 mode, color 0 & 1 mode, and color 1 & 0 mode. As will be seen, substantial time is saved with any of these modes of operation simply through the lack of a requirement to load the color value registers for writing to each row of the display when foreground and background colors are being written.

In the color 0 mode of operation, if a control signal value of one is transferred on a particular data conductor 58, then the value in the color register C0 is written to the storage positions which define the pixel addressed for that conductor 58. The value in the color register C0 is also transferred to all other storage positions at addresses to which one control values are transferred on the data conductors 58. On the other hand, no color value is written to the pixel positions to which a zero control value is transferred on a data conductor 58. Thus, thirty-two different pixel positions may be affected in a single simultaneous transfer; those positions which receive a one value are enabled to receive the value in the color register C0 while those which receive a zero value remain unchanged.

Presuming that the color value register C0 has been loaded with a pattern of eight bits which is repeated four times in the thirty-two bits provided in that register and that the color value register C1 has been loaded with another pattern of eight bits which is repeated four times in the thirty-two bits provided in that register, then a row and eight columns are selected by the address on the address bus through the row and column address decode circuitry 54 and 56 in the manner described above. Assuming that color mode 0 is selected, all eight of the multiplexors 62 on each plane select the register C0 as the source of color data for the array. Then, particular write drivers 73 are enabled in accordance with the enabling signals appearing on the conductors 58 of the data bus.

The data appearing on the conductors 58 is sent to a pixel mask register 55. The bits of the pixel mask register are used to control all of the drivers 73 in of the array planes controlling transfer of data to a the particular pixels. For example, with eight bit color and assuming that the first eight columns have been selected by the column address, the bits defining the first pixel lie in the first column in the selected row and the first eight planes of that column. The first pixel P1 in the pixel mask register 55 controls the appropriate drivers 73 to transfer the color to these bit positions in the array from the color value register C0. Consequently, with one row and eight columns selected, a total of thirty-two eight bit color pixels may be written simultaneously with the value stored in the color value register C0.

Color 1 mode is similar to color 0 mode except that a one value is transferred on any particular data conductor 58 causes the value in the color register C1 to be written to the storage positions which define the pixel addressed for that conductor 58. On the other hand, no color value is written to any of the pixel positions controlled by a data conductor 58 which receives a zero control value.

As may be seen, the color 0 and color 1 modes provide fast write operation similar to the four bit block mode used in prior art frame buffers. These modes may be used to clear the screen very rapidly or to otherwise provide a single color to the window area. For example, a frame buffer 30 for a display which is 1024×780 pixels and eight bits deep, may be cleared approximately thirty-two times faster than individual pixels may be written one by one to the frame buffer 50. Since the two color registers C0 and C1 may be loaded prior to manipulating any portion of a window and are always available, a series of pixels (e.g., thirty-two) may be written in two accesses without any need to reload color registers.

However, even faster writing is possible using the color modes 0 & 1 and 1 & 0 in those portions of the display in which clipping is unnecessary. As is pointed out in the co-pending patent application referred to above, most operations involved in writing to the display utilize two colors. Where clipping is not necessary, use of the modes 0 & 1 and 1 & 0 allow two colors to be written simultaneously to the frame buffer. In these modes a zero value on a data conductor 58 indicates that a color value is to be written to the controlled pixels from one color value register while a one value on a data conductor 58 indicates that a color value is to be written to the controlled pixels from the other color value register.

This is accomplished by combining the value transferred on the data conductor 58 for each plane and stored in the pixel mask register 55 with the color mode control signal to select the particular color register from which the color value is transferred by the multiplexors 62. For example, when in color mode 0 & 1 or 1 & 0, a zero in a bit position in the pixel mask register 55 causes a multiplexor 62 to select the color value stored in one color value register while a one in a bit position in the pixel mask register 55 causes a multiplexor 62 to select the color value stored in the other color value register. Then, the color mode control signals indicating mode 0 & 1 or 1 & 0 control all of the pixels selected to be written to the array. This allows two separate colors representing both foreground and background to be written simultaneously to those portions of a window area which do not require clipping.

The provision of the two color value registers allows a number of new methods of writing data to the frame buffer to be practiced in addition to the color modes described. For example, color pixels of eight, sixteen, and thirty-two bits may be written to the display in groups of pixels equal to the number of data conductors on the data bus as was described above. In addition, block modes are provided by which an entire row of pixels may be written in one color with clipping or in two colors unclipped. These modes are referred to as block 256, block 512 and block 1024 modes and are described in detail in the U.S. patent Application entitled *Multiple Block Mode Operations In A Frame Buffer System Designed For Windowing Operations*, referred to above.

The invention of the co-pending patent application provides a plurality of different modes by which the frame buffer may be written. In each of the writing modes every bit on the data conductors affects a different number of bits in the frame buffer. The first mode provided is the normal mode of operation described above in which each data conductor affects a single bit stored in the frame buffer. This mode is used for the operations which require writing to the display a pixel at a time. This mode allows any color to be written to a pixel position. This mode is, of course, the conventional slow normal mode used by prior art frame buffers which requires 120 ns. for each pixel written.

A second mode of operation is called block 8 mode. In this mode the value transferred on each data conductor 38 is used as an enabling signal which affects eight bits stored in the frame buffer. This mode is used for write operations with programs which utilize eight bit color. It allows as many eight bit pixels to be written simultaneously as there are data conductors; in the exemplary system, thirty-two pixels may be written in a single access. Utilizing two color registers, any of the four color modes of operation are possible in this mode. Thus, certain pixels may be enabled to be written with one color value from one of the color value registers (or another color from the other register) while other pixels are ignored using color 0 and color 1 modes. Moreover, all of the pixels affected by the data conductors may be written simultaneously with two distinct colors held in the two color value registers using color 0 & 1 and color 1 & 0 modes.

In a third mode of operation referred to as block 16 mode, each data conductor affects sixteen bits stored in the frame buffer. In this mode, the number of individual multiplexors 42 on each plane in FIG. 4 is increased from eight to at least sixteen or to thirty-two. Similarly, the number of columns which may be selected simultaneously by the column address is increased to allow the selection of sixteen columns simultaneously. By making these changes and providing signals to allow a total of thirty-two pixels of sixteen bits each to be written from the color register, a block 16 mode is provided which is similar to the block eight mode and is used for the operations with programs which utilize sixteen bit color. It allows as many sixteen bit pixels to be written simultaneously as there are data conductors; in the exemplary system, thirty-two sixteen bit pixels may be written in a single access. Utilizing the two color value registers illustrated, any of the four color modes of operation are possible in this mode.

In a fourth mode of operation referred to as block 32 mode, each data conductor affects thirty-two bits stored in the frame buffer. In this mode, the number of individual multiplexors 42 on each plane in FIG. 4 is increased from eight to at least thirty-two, the number of columns which may be selected simultaneously by the column address is increased to allow the selection of thirty-two columns simultaneously, and the control signals are modified to accommodate these changes. This mode is also similar to the block eight and sixteen modes and is used for the operations with programs which utilize thirty-two bit color.

As will be understood by those skilled in the art, the block eight, sixteen, and thirty-two modes of operations are devised to allow very fast writing of pixels to the frame buffer (approximately thirty-two times as fast as normal mode operations) in groups equal to the number of data conductors in either one or two colors. Consequently, these different block write modes with color 0 & 1 and 1 & 0 modes allows a 1024 pixels row to be written in a series of thirty-two pixels accesses which requires a single RAS signal and one CAS signals for each thirty-two pixels in the row.

Three additional modes of write access are provided which further increase the speed of operation of the frame buffer. A first of these modes is referred to as block 256 mode. In block 256 mode, the value on each data conductor determines the color value written to thirty-two adjacent eight bit pixel positions. This is accomplished by the column address selecting one quarter of the total of columns (256) in each plane of the array simultaneously. Then each of the pixels connected to each of these columns receives the single color value in a color value register designated by the value carried on the data conductor in the particular color mode. It will be seen that in block 256 mode a total of thirty-two times thirty-two total eight bit pixels (1024 pixels) are affected at once by each write access. This is a typical number of pixels in a row of a modern computer color monitor. Thus, each access of eight bit pixels in block 256 mode may write all of the pixels in a 1024 pixel row. It will be appreciated that this mode may be used to very rapidly clear an entire screen or to write a pattern which varies in thirty-two bit blocks on the screen. The block 256 mode is especially useful when used with the block eight mode to clear a window and clip to the boundaries of the window when using eight bit color.

A second additional mode is referred to as block 512 mode. In block 512 mode each data conductor affects the value of data written to thirty-two adjacent sixteen bit pixel positions. In this mode, the column address selects a total of half the columns in each plane simultaneously. This mode requires the increase in number of selection conductors, multiplexors 42, and other components discussed above to sixteen. This mode is used with the block 16 mode in the same manner that block 256 mode is used with block 8 mode to rapidly write to an entire row within a clipped window area of the display. A third additional mode is referred to as block 1024 mode. In block 1024 mode, all of the columns in each plane are selected simultaneously by the column address. This mode requires the increase in number of selection conductors, multiplexors 42, and other components discussed above to thirty-two. In block 1024 mode, each data conductor affects the value of data written to thirty-two adjacent thirty-two bit pixel positions. This mode is used with the block 32 mode in the same manner that block 256 mode is used with block 8 mode to rapidly write to an entire row within a clipped window area of the display. Each of these modes provides useful functions in the same manner as does block 256 mode but for configurations of frame buffers storing data describing sixteen bit and thirty-two bit pixels.

In addition to the color values registers C0 and C1 and block modes which provide fast operation, the frame buffer 50 of FIG. 4 includes output circuitry by which pixel data is shifted to an output display device (not shown in the figure). This output circuitry includes a multiplexor 77 which is utilized to shift data eight bits at a time in each plane of the array to an output shift register 80. The data in the register 80 is then shifted a bit at a time by another multiplexor 82 to a circuitry controlling the display of the pixel data on an output display device.

One of the slowest operations performed in a frame buffer is the scrolling of data. In a scrolling operation rows of data are moved up or down on the output display. Since the data describing the pixels which are displayed on an output display device is stored in a frame buffer, scrolling in prior art frame buffers has required that the pixel data in the frame buffer describing a row of the display be read from the frame buffer by the central processor and written back to another position in the frame buffer. In a typical personal computer, thirty-two bits of data (one pixel in thirty-two bit color or four pixels is eight bit color) are read from the frame buffer simultaneously in an operation that typically requires 120 nanoseconds. This is followed by an access to write the data back to the appropriate positions in the frame buffer which again requires 120 nanoseconds. This pattern of reading and writing is continued until an entire row has been read and rewritten. Since a typical screen may hold rows of 1024 pixels, 240 nanoseconds times 1024 pixels is required to scroll a single row of thirty-two bit color pixels on the display or one-fourth that time for eight bit pixels. Each line of text takes up approximately twelve rows of pixels so scrolling a line of text takes a very long time.

In addition to providing output which may be transferred to an output display device, the frame buffer 50 includes a series of latches 0-3 which may receive data read from large portions of rows (one-quarter of a row) in a single access and in essence provide an internal data bus for scrolling operations. These latches increase the speed of scrolling operations by approximately 85 times the speed of prior art scrolling operations. The essence of the operation is that 32 pixels are placed in the latches in each of a series of four succeeding accesses. These pixels are then written back to new positions in the array through the multiplexors 62 in a series of four additional accesses. The scrolling operations and circuitry are described in detail in the U.S. patent Application entitled *Method and Apparatus For Increasing The Rate Of Scrolling In A Frame Buffer Designed For Windowing Operations,* referred to above.

As pointed out above, even with these improvements, more speed is desired from frame buffer operations.

FIG. 5 is a timing diagram illustrating the signals necessary and the time typically required to accomplish the loading of a color value in the single color value register used by a prior art frame buffer and to follow that loading by writing one or more pixels of that color value to the array of the frame buffer. The diagrams presume that the pixels to be written are in a row presently being accessed in the array. As may be seen, on the failing edge of a full RAS cycle, a control signal indicating that the color value register is to be loaded is furnished to the frame buffer. During the same period, no value of data is furnished on the data conductors from the data bus and no address is furnished on the address bus. As the RAS cycle nears its end, a CAS cycle may be initiated. On the failing edge of the CAS cycle, a color value is furnished on the data conductors from the data bus and is loaded into the color value register. The value on the address bus is not used at this time. This completes the loading of the color value register in 120 ns. using typical components available in the art.

Once the color value register is loaded, the value in that register may be written to various pixel addresses. However, the row address is no longer valid in prior art frame buffers since an operation other than a write to the selected row has occurred (the loading of the color value register). Thus, another RAS cycle is required to furnish a proper row address; and on the failing edge of this RAS cycle, the row address is asserted. Again, no value is necessary on the data conductors. Once the appropriate row has been selected during the RAS cycle, a CAS cycle is required to furnish the column address for the write operation and to furnish the pixel selection control data for that write operation on the data conductors. Since it is presumed that the color value register which has just been loaded is being used, the data conductors carry values indicating the pixel positions to which the color is to be written beginning at the designated column address. Thus, this write operation requires another 120 ns, and the total operation to change the color value and write the pixel positions has taken 240 ns.

This is to be contrasted with the operation illustrated in FIG. 6. As in FIG. 5, the pixels to be written are presumed to lie in the row presently being accessed. Since a RAS signal is not necessary to control the loading of the color value to the color value register, the RAS signal remains low during the entire operation so that the row address already being accessed remains selected. A CAS cycle is utilized to furnish the color value on the data conductors. This CAS cycle may be initiated without delay and requires 20 ns. The address bus is not utilized although control signals indicating a color load operation transferred on the falling edge of the CAS cycle might utilized the address bus lines or a separate control line. Thus, loading a color value register requires only 20 ns. Since the row address remains correct, a write access may immediately follow. This utilizes another CAS cycle of 20 ns. during which a column address for the write operation is furnished on the address bus and the control data indicating the enabled pixel positions is furnished for the block write on the data conductors of the data bus. Thus, the time required for the entire operation using the present invention is 40 ns. This is to be contrasted to the 240 ns. required to accomplish the operation using the frame buffers and techniques of the prior art.

FIG. 7 is a timing diagram which illustrates a similar type of operation in a prior art frame buffer. In this operation, a plane mask register is loaded to indicate which planes are to be written in a particular operation. In prior art frame buffers, it is necessary to furnish the plane mask value (those planes which are to be written in the operation) with each RAS cycle in which data is written in order to indicate the proper array setup. The plane mask value is furnished on the data conductors along with the row address on the address bus during the falling edge of an initial RAS cycle. Then, a column value and data to be written may be furnished on the falling edge of a CAS cycle. This requires a total of 120 ns. including the operation to write a pixel (or pixels in block mode).

FIG. 8 is a timing diagram which illustrates the operations required for loading a plane mask register using a frame buffer designed in accordance with the present invention and the method of the present invention. Since the loading of the plane mask value into the plane mask register does not affect the value of the row, a RAS signal is not necessary to control the loading of the plane mask value, the RAS signal remains low with the same row value originally loaded and the row address remains selected. Consequently, a CAS cycle is utilized to furnish a control signal indicating that the plane mask is to be loaded and the plane mask value on the data conductors. This CAS cycle may be initiated without delay and requires 20 ns. The address bus is not utilized although control signals indicating the plane mask load operation might utilize the address bus lines or a separate control line. Thus, loading a plane mask register requires 20 ns. only. Since the row address remains correct, a write access may immediately follow. Such an access utilizes another CAS cycle of 20 ns. during which a column address for the write operation is furnished on the address bus and data (or block data indicating the enabled pixel positions) is furnished for the block write on the data conductors of the data bus. Thus, the time required for the entire operation using the present invention is 40 ns. This is to be contrasted to the 120 ns. required to accomplish the operation using the frame buffers and techniques of the prior art. Consequently, the operation is approximately three times as fast using the present invention.

Another advantage of the present invention is that there is no need to reload the plane mask value with each RAS cycle as long as the value does not change. In contrast to the requirement of the prior art to load the plane mask register at each RAS cycle of a write operation, the present invention retains the plane mask value until it is changed. Thus, all of the time used to load this value as each row is written is eliminated by the present invention.

Figure 9:
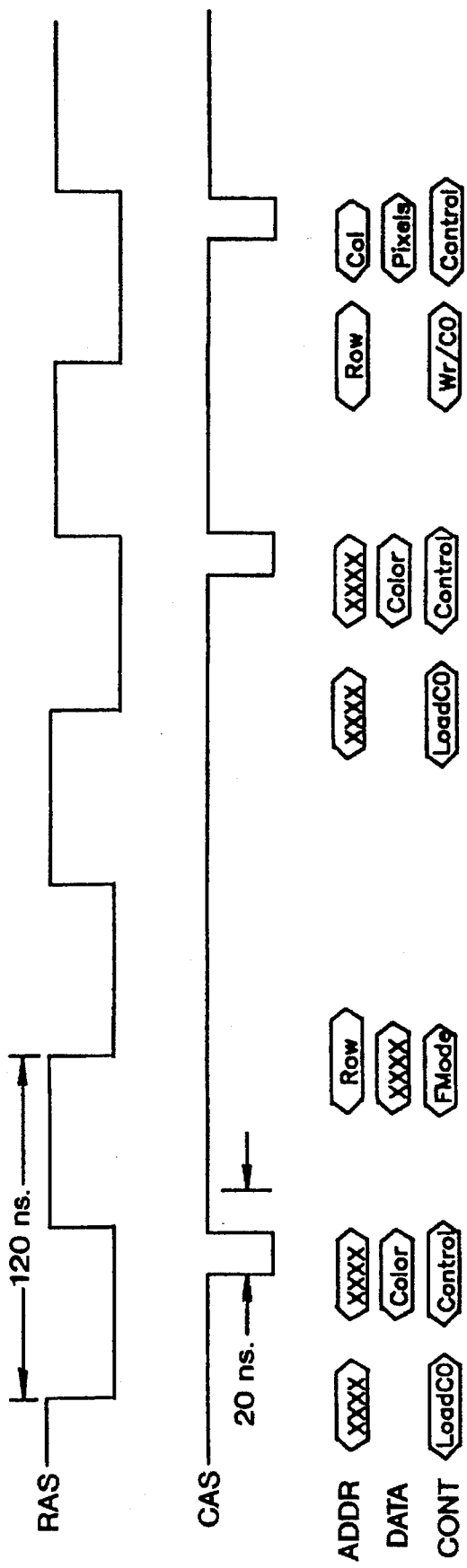
FIG. 9 is a timing diagram which illustrates an operation performed using prior art frame buffers and prior art techniques.

As has been illustrated, arranging the frame buffer so that a RAS cycle is necessary for and affects only a row address operation eliminates significant amounts of operational time which were wasted in prior art register loading operations. In addition to the time saved in register loading, this technique also saves time in the operations which do require a row address assertion. FIG. 9 is a timing diagram which illustrates how a prior art frame buffer carries out a flash write operation of background color followed by a pixel write of foreground color using the prior art block mode. In a flash write operation, one to four entire rows of a display are written simultaneously, all with a single identical color. First is necessary to load the single color value register with the background color. This requires a first RAS cycle like that illustrated in FIG. 5 in which the background color is placed in the single color value register. This is followed by the flash write operation which commences on the failing edge of a second RAS cycle at which a row address is furnished on the address bus while the data bus remains unused. A combination of control signals are used to indicate the flash write mode of operation. Since no column need be selected where an entire row or rows is affected, the flash write requires only the minimum 120 ns. for the RAS cycle to write the color value stored in the color register to all of the pixels in the designated row or rows.

After the background color is written to the row or rows of pixels, a third RAS cycle is required to change the color in the single color value register to foreground color. Finally, a fourth RAS cycle is required to select the row of the write (on the address bus). The column for the write of foreground color is furnished on the address bus on the failing edge of a CAS cycle. Control data indicating the enabled pixels is furnished as data during the same CAS cycle along with control signals indicating the block write operation. Thus, the operation requires four full RAS cycles totaling 480 ns. using prior art frame buffers and techniques and allows the writing of thirty-two four bit foreground pixels. A slightly shorter time is required to provide the flash write operation and write a single foreground pixel using the normal write mode because the filling of the color register a second time is not required.

Figure 10:
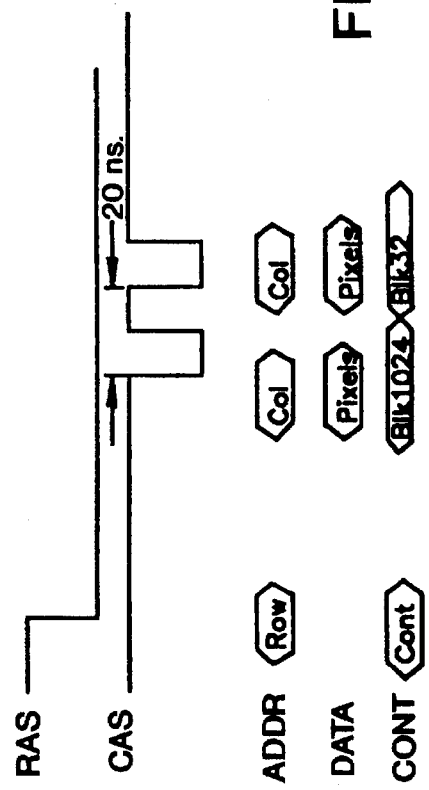
FIG. 10 is a timing diagram which illustrates an operation similar to that illustrated in FIG. 9 performed using frame buffers in accordance with the present invention.

FIG. 10 is a timing diagram which illustrates a block operation similar to the flash write operation of the prior art followed by a foreground write operation using a frame buffer constructed in accordance with the present invention. Since the color registers are normally loaded with foreground and background colors at all times, loading these registers is not normally required for this operation. A RAS cycle is required using the present invention to indicate the appropriate row to be written with background color. The row address and control signals are latched on the falling edge of the RAS cycle. The write of background color is completed by a block 1024 write operation of the pixels of the entire row using the color value in one of the color registers on the falling edge of a first CAS cycle. On the falling edge of a second CAS cycle, the address of a column to be written with foreground color, the control data indicating the enabled pixels, and a control mode signal indicating a block write of 32 pixels with foreground color are furnished to complete the foreground write. As may be seen, since the row address does not change and block modes in the present invention affect only one row, no extra RAS cycle is necessary. Thus, the entire operation requires only 140 ns. contrasted to the 480 ns. required for a similar operation by the prior art frame buffer.

FIG. 11 is a timing diagram which illustrates a number of read transfer operations accomplished using a prior art frame buffer. As may be seen, in order to read a row of pixel data from a frame buffer, it is necessary to provide both a RAS and a CAS cycle in order to transfer the data to the output shift register. The transfer cycle is shown followed by a second generalized RAS cycle followed by a CAS cycle which is necessary in order for any other operation to follow. Consequently, a total of 240 ns. are required for the entire operation.

FIG. 12 is a timing diagram which illustrates a number of read transfer operations accomplished using a frame buffer and techniques of the present invention. As may be seen, a RAS cycle is necessary to indicate the row of the frame buffer array which is being read. Then four individual CAS cycles of 20 ns. each follow to indicate the column of the particular 256 pixel portion being transferred to the display; it will be recalled that the frame buffer transfers a total of 256 eight bit pixels at once to the output shift register 80, so the operation is accomplished in four incremental portions. Consequently, the read/transfer cycle of a single row requires only 180 ns. compared to the 240 ns. required to accomplish the read/transfer cycle using prior art frame buffers. It should be noted that if the operation just prior to the read/transfer cycle happens to be one involving the same row of the array, then there is no need for the RAS cycle at all and the total time is reduced to 80 ns. to accomplish the read/transfer cycle for the entire row of 1024 pixels.

FIG. 13 is a timing diagram which illustrates an operation for providing the register latch reads used in scrolling in the present invention. Similar to the other operations discussed above, these read operations may be accomplished quite rapidly using the present invention. These operations were not required in frame buffers of the prior art because those frame buffers did not include the latches of the present arrangement which allow the very rapid scrolling provided by the present arrangement. Since the operation to read the latches does not require the specification of a row address, no RAS cycle is required. Instead, the CAS cycle alone is used to transfer both the address of the particular register and the data to be transferred. As may be seen, this requires only the 20 ns. of the CAS cycle to accomplish.

It is especially interesting to note that the present invention drastically reduces the number of RAS cycles used is all of the different operations just described. In addition to reducing the time required to accomplish these operations, it is to be noted that RAS operations are much longer than are CAS cycles and consequently require a good deal more power than do those operations. Because of this, the present invention offers substantial power saving features over frame buffers and techniques utilized by the prior art.

Figure 14:
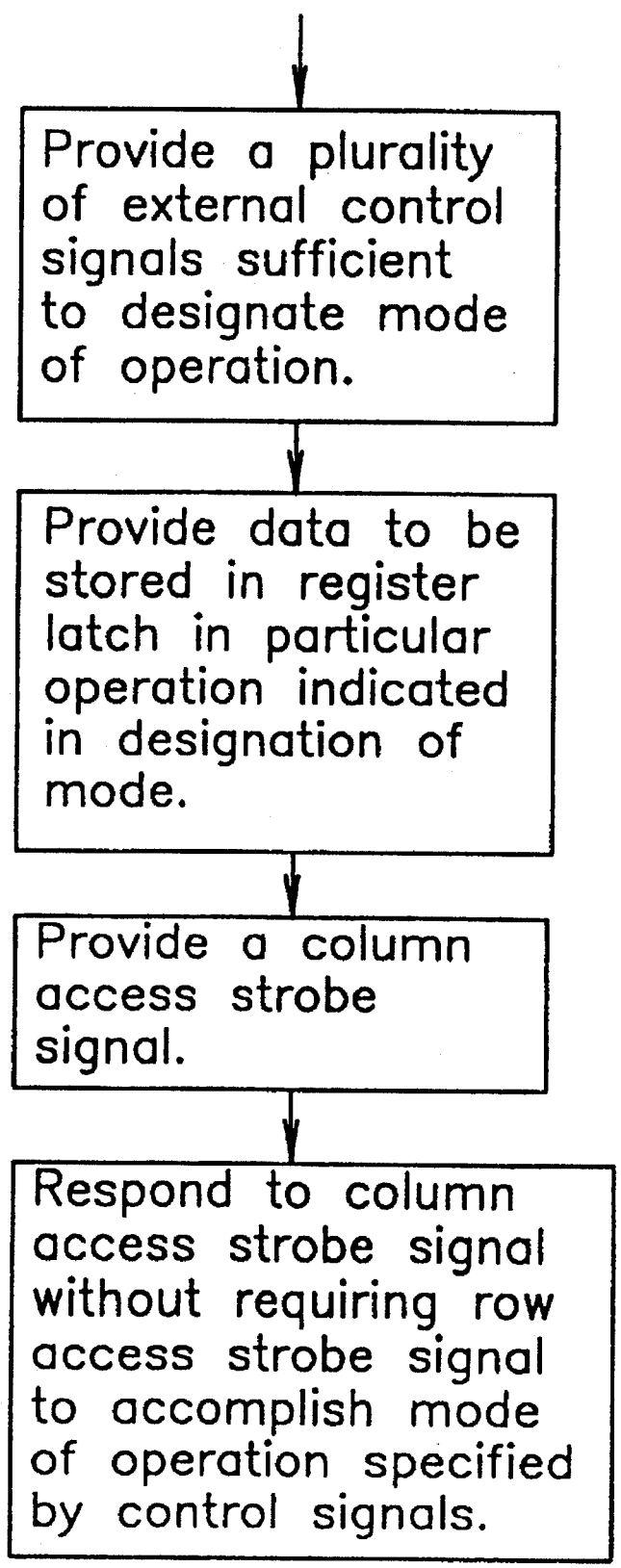
FIG. 14 is a flow chart illustrating in general the details of a method of the invention.

FIG. 14 is a flow chart illustrating in general the details of the method of the invention by which the various operations of the frame buffer which are not related to changing access to a particular row of the array of the frame buffer may be accomplished without the need for a row access strobe signal.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a frame buffer having an array including at least one plane of memory devices for storing data for display on an output display device, a plurality of registers for storing data to control access to the array of the frame buffer and data written to the memory devices of the frame buffer, a plurality of latches for storing data from the memory devices of the array and from which data is read for storage in the memory devices of the array, and an input bus for transferring data to and from the frame buffer, a method of writing to or reading from the plurality of registers and latches of the frame buffer which comprises the steps of:

providing control signals sufficient to indicate a particular color mode representing one of a plurality of different bit color operations and a particular color block mode of operation to be accomplished with respect to a particular register or latch, providing any data required to be stored in the particular register or latch in any operation to be accomplished based on the indicated color mode and color block mode, providing a column address strobe signal, and responding to the column address strobe signal without requiring any row address strobe signal to accomplish any operation specified by the control signals sufficient to indicate a particular mode of operation storing any data required to be stored in the particular register or latch in the operation to be accomplished.

2. The method of writing to or reading from a plurality of registers and latches of a frame buffer as claimed in claim 1 in which the step of providing control signals sufficient to indicate a particular mode of operation to be accomplished with respect to a particular register or latch comprises:

furnishing a signal to indicate modes of operation which include write operations, furnishing a signal to indicate modes of operation which include output operations, and furnishing at least four additional control signals for selecting particular modes of operation.

3. The method of writing to or reading from a plurality of registers and latches of a frame buffer as claimed in claim 2 in which the step of providing any data required to be stored in a particular register or latch in any operation to be accomplished comprises furnishing color value data on the input bus for storage in a plurality of color value registers.

4. The method of writing to or reading from a plurality of registers and latches of a frame buffer as claimed in claim 2 in which the step of providing any data required to be stored in a particular register or latch in any operation to be accomplished comprises furnishing plane mask data on the input bus for storage in a plane mask register.

5. The method of writing to or reading from a plurality of registers and latches of a frame buffer as claimed in claim 2 in which the step of providing any data required to be stored in a particular register or latch in any operation to be accomplished comprises furnishing pixel mask data on the input bus for storage in a pixel mask register.

6. The method of writing to or reading from a plurality of registers and latches of a frame buffer as claimed in claim 2 in which the step of providing any data required to be stored in a particular register or latch in any operation to be accomplished comprises reading pixel data from memory cells of the array for storage in selected ones of the plurality of latches, and in which the step of responding to the column access strobe signal without requiring any row address strobe signal to accomplish any operation specified by the control signals sufficient to indicate a particular mode of operation further comprises the step of reading data from the selected ones of the plurality of latches for storage in memory cells of the array.

7. The method of writing to or reading from a plurality of registers and latches of a frame buffer as claimed in claim 2 in which the step of providing any data required to be stored in a particular register or latch in any operation to be accomplished comprises reading pixel data from memory cells of the array for storage in selected ones of the plurality of latches, and in which the step of responding to the column access strobe signal without requiring any row address strobe signal to accomplish any operation specified by the control signals sufficient to indicate a particular mode of operation further comprises the step of reading data from the selected ones of the plurality of latches for transfer to an output display device.

8. A frame buffer comprising an array including at least one plane of memory devices for storing data for display on an output display device, a plurality of registers for storing data to control access to the array of the frame buffer and data written to the memory devices of the frame buffer, a first plurality of latches for storing data from the memory devices of the array and from which data is read for storage in the memory devices of the array, a shift register for storing data from the memory devices of the array and from which data is read for transfer to an output display device, an input bus for transferring data to and from the frame buffer, means for providing control signals sufficient to indicate a particular color mode representing one of a plurality of different bit color operations and a particular block mode of operation to be accomplished with respect to a particular register, latch, or shift register;

means for providing any data required to be stored in the particular register, latch, or shift register in any operation to be accomplished based on the indicated color mode and block mode, means for providing a column address strobe signal, and means for responding to the column address strobe signal without requiring any row address strobe signal to accomplish any operation specified by the control signals sufficient to indicate a particular mode of operation means for storing any data required to be stored in the particular register, latch, or shift register in the operation to be accomplished.

9. A frame buffer as claimed in claim 8, in which the means for providing control signals sufficient to indicate a particular mode of operation to be accomplished with respect to a particular register, latch, or shift register comprises:

means for furnishing a signal to indicate modes of operation which include write operations, means for furnishing a signal to indicate modes of operation which include output operations, and means for furnishing at least four additional control signals for selecting particular modes of operation.

10. A frame buffer as claimed in claim 9 in which the means for providing any data required to be stored in a particular register, latch, or shift register in any operation to be accomplished comprises means for furnishing color value data on the input bus for storage in a plurality of color value registers.

11. A frame buffer as claimed in claim 9 in which the means for providing any data required to be stored in a particular register, latch, or shift register in any operation to be accomplished comprises means for furnishing plane mask data on the input bus for storage in a plane mask register.

12. A frame buffer as claimed in claim 9 in which the means for providing any data required to be stored in a particular register, latch, or shift register in any operation to be accomplished comprises means for furnishing pixel mask data on the input bus for storage in a pixel mask register.

13. A frame buffer as claimed in claim 9 in which the means for providing any data required to be stored in a particular register, latch, or shift register in any operation to be accomplished comprises means for reading pixel data from memory cells of the array for storage in selected ones of the plurality of latches, and in which the means for responding to the column access strobe signal without requiring any row address strobe signal to accomplish any operation specified by the control signals sufficient to indicate a particular mode of operation further comprises means for reading data from the selected ones of the plurality of latches for storage in memory cells of the array.

14. In a frame buffer having an array including at least one plane of memory devices for storing data for display on an output display device, a plurality of registers for storing data to control access to the array of the frame buffer and data written to the memory devices of the frame buffer, a plurality of latches for storing data from the memory devices of the array and from which data is read for storage in the memory devices of the array, and an input bus for transferring data to and from the frame buffer, the improvement comprising:

means for providing control signals sufficient to indicate a particular color mode representing one of a plurality of different bit color operations and a particular block mode of operation to be accomplished with respect to a particular register or latch, means for providing any data required to be stored in the particular register or latch in any operation to be accomplished based on the indicated color mode and block mode, means for providing a column address strobe signal, and means for responding to the column address strobe signal without requiring any row address strobe signal to accomplish any operation specified by the control signals sufficient to indicate a particular mode of operation means for storing any data required to be stored in the particular register or latch in the operation to be accomplished.

15. In a frame buffer as claimed in claim 14, the improvement in which the means for providing control signals sufficient to indicate a particular mode of operation to be accomplished with respect to a particular register or latch comprises:

means for furnishing a signal to indicate modes of operation which include write operations, means for furnishing a signal to indicate modes of operation which include output operations, and means for furnishing at least four additional control signals for selecting particular modes of operation.

16. In a frame buffer as claimed in claim 15, the improvement in which the means for providing any data required to be stored in a particular register or latch in any operation to be accomplished comprises means for furnishing color value data on the input bus for storage in a plurality of color value registers.

17. In a frame buffer as claimed in claim 15, the improvement in which the means for providing any data required to be stored in a particular register or latch in any operation to be accomplished comprises means for furnishing plane mask data on the input bus for storage in a plane mask register.

18. In a frame buffer as claimed in claim 15, the improvement in which the means for providing any data required to be stored in a particular register or latch in any operation to be accomplished comprises means for furnishing pixel mask data on the input bus for storage in a pixel mask register.

19. In a frame buffer as claimed in claim 15, the improvement in which the means for providing any data required to be stored in a particular register or latch in any operation to be accomplished comprises means for reading pixel data from memory cells of the array for storage in selected ones of the plurality of latches, and in which the means for responding to the column access strobe signal without requiring any row address strobe signal to accomplish any operation specified by the control signals sufficient to indicate a particular mode of operation further comprises means for reading data from the selected ones of the plurality of latches for storage in memory cells of the array.

20. In a frame buffer as claimed in claim 15, the improvement in which the means for providing any data required to be stored in a particular register or latch in any operation to be accomplished comprises means for reading pixel data from memory cells of the array for storage in selected ones of the plurality of latches, and in which means for responding to the column access strobe signal without requiring any row address strobe signal to accomplish any operation specified by the control signals sufficient to indicate a particular mode of operation further comprises means for reading data from the selected ones of the plurality of latches for transfer to an output display device.

\* \* \* \* \*